United States Patent
Leatherdale et al.

(10) Patent No.: US 12,092,694 B2
(45) Date of Patent: Sep. 17, 2024

(54) ACTIVE BATTERY MANAGEMENT METHOD FOR ECONOMIC OPTIMIZATION

(71) Applicant: 3M INNOVATIVE PROPERTIES COMPANY, St. Paul, MN (US)

(72) Inventors: Catherine A. Leatherdale, Woodbury, MN (US); Brian E. Brooks, St. Paul, MN (US); Gilles J. Benoit, Minneapolis, MN (US); Peter O. Olson, Andover, MN (US); Tyler W. Olson, Woodbury, MN (US); Himanshu Nayar, St. Paul, MN (US); Frederick J. Arsenault, Stillwater, MN (US); Nicholas A. Johnson, Burnsville, MN (US); Vincent J.L. Chevrier, St. Paul, MN (US); Don Vincent West, St. Paul, MN (US); Brandon A. Bartling, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 808 days.

(21) Appl. No.: 17/274,307

(22) PCT Filed: Sep. 10, 2019

(86) PCT No.: PCT/US2019/050281
§ 371 (c)(1),
(2) Date: Mar. 8, 2021

(87) PCT Pub. No.: WO2020/055778
PCT Pub. Date: Mar. 19, 2020

(65) Prior Publication Data
US 2021/0336471 A1 Oct. 28, 2021

Related U.S. Application Data

(60) Provisional application No. 62/729,598, filed on Sep. 11, 2018.

(51) Int. Cl.
*H02J 7/00* (2006.01)
*G01R 31/367* (2019.01)
(Continued)

(52) U.S. Cl.
CPC ......... *G01R 31/367* (2019.01); *G01R 31/382* (2019.01); *G01R 31/392* (2019.01);
(Continued)

(58) Field of Classification Search
USPC ....................................... 320/134
See application file for complete search history.

(56) References Cited

U.S. PATENT DOCUMENTS

| 6,555,991 B1 | 4/2003 | Zettel et al. |
| 6,687,631 B2 * | 2/2004 | Yoon .................. G01R 31/2839 324/436 |

(Continued)

FOREIGN PATENT DOCUMENTS

| CN | 1975444 A | 6/2007 |
| CN | 1862279 B | 4/2010 |

(Continued)

OTHER PUBLICATIONS

Diaz, "Impact of Electric Vehicles as Distributed Energy Storage in Isolated Systems: The Case of Tenerife," 2015, sustainability, vol. 7, pp. 15152-15178.

(Continued)

*Primary Examiner* — Samuel Berhanu
(74) *Attorney, Agent, or Firm* — Bryan Walker

(57) ABSTRACT

Method for active battery management to optimize battery performance. The method includes providing signal injections for charging and discharging of a battery. The signal injections include various charging and discharging profiles, rates, and endpoints. Response signals corresponding with the signal injections are received, and a utility of those (Continued)

signals is measured. Based upon the utility of the response signals, data relating to charging and discharging of the battery is modified to optimize battery performance and to determine when to discharge the battery into a power grid in order to return power to the grid in exchange for an economic benefit such as a payment or rebate from a utility company.

20 Claims, 12 Drawing Sheets

(51) Int. Cl.
    *G01R 31/382*     (2019.01)
    *G01R 31/392*     (2019.01)
    *G01R 31/396*     (2019.01)
    *H01M 10/42*     (2006.01)
    *H01M 10/44*     (2006.01)
    *H01M 10/48*     (2006.01)
    *H02J 7/04*     (2006.01)

(52) U.S. Cl.
    CPC ........ *G01R 31/396* (2019.01); *H01M 10/425* (2013.01); *H01M 10/443* (2013.01); *H01M 10/48* (2013.01); *H01M 10/486* (2013.01); *H02J 7/00032* (2020.01); *H02J 7/0047* (2013.01); *H02J 7/0048* (2020.01); *H02J 7/005* (2020.01); *H02J 7/04* (2013.01); *H01M 2010/4271* (2013.01); *H01M 2220/20* (2013.01)

(56) References Cited

U.S. PATENT DOCUMENTS

| | | | |
|---|---|---|---|
| 8,564,246 | B2 | 10/2013 | Wade et al. |
| 9,476,946 | B2 | 10/2016 | Schlag et al. |
| 2010/0007310 | A1* | 1/2010 | Kawamoto ......... H01M 10/486 320/134 |
| 2012/0153889 | A1* | 6/2012 | Xie ....................... H02J 7/0034 320/107 |
| 2013/0307475 | A1* | 11/2013 | Kishiyama .............. B60L 53/11 320/109 |
| 2014/0097787 | A1 | 4/2014 | Lin |
| 2015/0021991 | A1 | 1/2015 | Wood et al. |
| 2015/0372279 | A1 | 12/2015 | Li |
| 2017/0229881 | A1 | 8/2017 | Pourmousavi Kani et al. |
| 2019/0115778 | A1* | 4/2019 | Ermon ............... H02J 7/007184 |
| 2020/0164763 | A1* | 5/2020 | Holme .................... B60L 58/16 |

FOREIGN PATENT DOCUMENTS

| | | |
|---|---|---|
| CN | 105005005 B | 10/2017 |
| CN | 107453408 | 12/2017 |
| CN | 107528337 | 12/2017 |
| WO | WO2018/126320 | 7/2018 |
| WO | WO2020/053702 | 3/2020 |
| WO | WO2020/188331 | 9/2020 |

OTHER PUBLICATIONS

Dzikiy "Orkney Islands project is a smart energy 'system of the future' using renewables, batteries, EVs" Apr. 2019, electrek, 4 pages.

Lambert, "Renault is trying to create a 'smart electric island' with electric vehicles, V2G, and energy storage," Feb. 2018, electrek, 4 pages.

Peterson, "The economics of using plug-in hybrid electric vehicle battery packs for grid storage," Journal of Power Sources, 2010, vol. 195, pp. 2377-2384.

International Search Report for PCT International Application No. PCT/IB2019/050281, mailed on Jan. 2, 2020, 3 pages.

* cited by examiner

ACTIVE BATTERY MANAGEMENT METHOD FOR ECONOMIC OPTIMIZATION

CROSS REFERENCE TO RELATED APPLICATIONS

This application is a national stage filing under 35 U.S.C. 371 of PCT/US2019/050281, filed Sep. 10, 2019, which claims the benefit of U.S. Provisional Application No. 62/729,598, filed Sep. 11, 2018, the disclosures of which are incorporated by reference in their entireties herein.

BACKGROUND

Battery management is of critical importance to a number of commercial applications ranging from consumer electronics to automotive electrification and grid-level energy storage. Battery management is also a key component of the value proposition of any battery system whose utility depends on delivering a minimum amount of energy reliably and safely over an extended period of time, from a couple of years for consumer electronics to a decade for grid installations.

SUMMARY

A first method for active battery management includes injecting randomized controlled signals in charging or discharging of a battery, including charging of the battery from a power grid, and ensuring the signal injections occur within normal operational ranges and constraints. The method also includes monitoring performance of the battery in response to the controlled signals, computing confidence intervals about the causal relationships between the battery performance and the controlled signals, and selecting optimal signals for the charging or discharging of the battery based on the computed confidence intervals, including discharging the battery into the power grid in exchange for an economic benefit.

A second method for active battery management includes providing signal injections for charging or discharging of a battery, including charging of the battery from a power grid, and receiving response signals corresponding with the signal injections. The method also includes measuring a utility of the response signals, accessing data relating to charging or discharging of the battery, including discharging the battery into the power grid in exchange for an economic benefit, and modifying the data based upon the utility of the response signals.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the invention include a method for improving battery management by implementing random experiments on the charge and discharge variables and inferring their causal effects on utility metrics such as energy capacity, power, fade rate, charge time, internal resistance, state of health, cell imbalance, temperature, cell swelling, electricity cost, and more. Linear combinations of any of the above utility metrics may also be defined to give the figure of merit which balances competing requirements. This battery management can be used in, for example, electric or hybrid vehicles, electric bicycles, consumer electronic devices, grid storage systems and other vehicles and devices using batteries.

The battery management methods can also include economic factors such as determining when to send power back to a power grid in exchange for an economic benefit, for example a payment, discount, or rebate from a utility company or another entity, and potentially what type of user demand to address, frequency regulation (high frequency) versus peak shaving (low frequency). In particular, embodiments include a method of optimizing the discharge and charging conditions for battery packs in electric vehicles or un-interruptible power systems so they can be used as a power source back to the grid without adversely affecting the battery pack lifetime. The method uses deep causal learning to maximize either net revenue from sales of power back to the utility grid or minimize electricity cost to the primary operator through techniques such as peak shaving. Deep causal learning, as described herein, is a particularly useful methodology for this problem as it is continually adaptable through the life of a battery pack.

Figure 1:
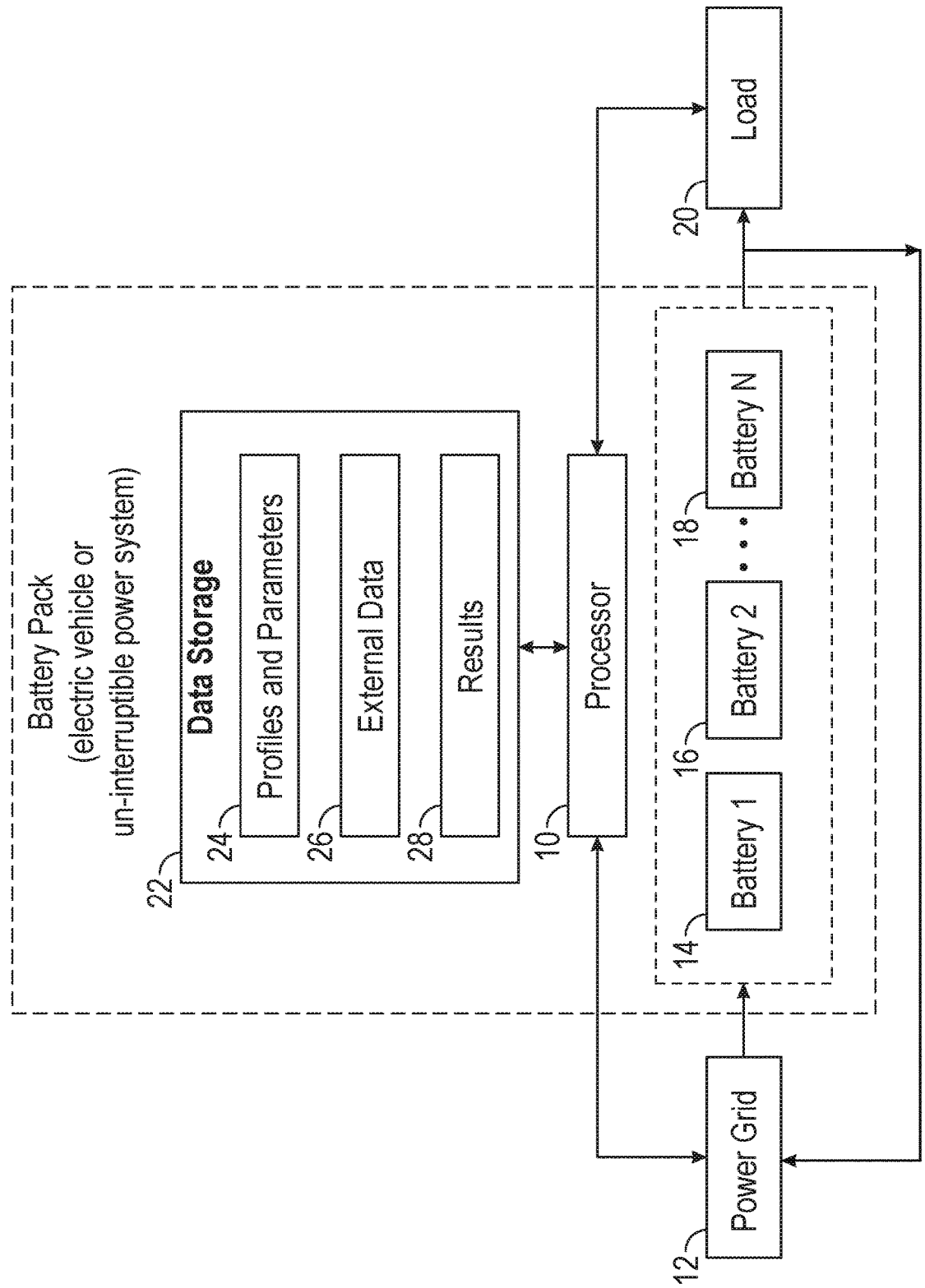
FIG. 1 is a diagram illustrating a system for implementing an active battery management method.

FIG. 1 is a diagram illustrating a system for implementing an active battery management method for a battery pack within an electric vehicle or un-interruptible power supply (or other stationary power source). The system includes a processor 10 electrically coupled with a power source from power grid 12, a load 20, and a data storage 22. Power grid 12 provides power for charging one or more batteries 14, 16, and 18, and the batteries provide power to load 20. In this application, the power grid can be a source of energy or a load when supplying power back to the grid. Data storage 22, such as an electronic memory, stores profiles and parameters 24, external data 26, and results 28. Results can include, for example, time series of current and voltage, energy capacity, temperature and more for each cell or string of cells.

In use, processor 10 injects signals to power grid 12 using profiles and parameters 24 and possibly external data 26 in order to evaluate the performance of batteries 14, 16, and 18, for example how the batteries perform for charging and discharging of them. Performance metrics can include, for example, delivered power, energy capacity, fade rate, revenue, profitability, reliability score (i.e., score given by utilities to market participants representing their ability to meet demand within the capacity allocated the day before). Processor 10 stores as results 28 the response to the signal injections, and those responses can be used to optimize performance of the batteries. The processing for the battery management can occur locally with dedicated firmware on the battery charging system, on standalone PC, or be cloud based and occur remotely from the batteries.

Profiles and parameters 24 include possible charging and discharging rates, charging and discharging profiles, and profile endpoints. Profiles and parameters 24 also include the frequency of doing a full charge/discharge cycle to obtain a fresh estimate of State Of Health (defined as maximum available capacity relative to maximum capacity at time zero), which applications to bid on (considering different applications can generate different revenues and have different impacts on the life of the battery pack), and for each application how much capacity to allocate to the "grid load" versus the standard load (more capacity=more revenue, but also greater chance of over discharge).

The charging and discharging profiles include the shape of such profiles and possibly time at a particular state of charge or voltage. The charging endpoints include the percentage of charge in the batteries at which to start and stop charging the batteries, and the discharging endpoints include the percentage of charge in the batteries at which to start and stop discharging the batteries. The profiles and parameters can be stored in look-up tables, for example. External data 26 can include, for example, environmental conditions or factors such as temperature, humidity, airflow around the batteries, time of day or year, time since turning on the device or vehicle using the batteries, estimated state of health (SOH) and state of charge (SOC) from an existing battery model (usually provided by the battery or BMS supplier). Also, active cooling or heating of the batteries can be used as other control variables with parameters of temperature set points, rates, and gradients in time and space. In the case of portable electronic devices, external data can also include the following with respect to such devices: usage of applications, user settings, a scheduled event or alarm, a power consumption pattern, a time of day, or the location of the device. Similarly in the case of an electrical vehicle, external data can include time of day or time next scheduled use, typical driving patterns for the vehicle, electricity cost versus time (i.e., for example to avoid peak pricing), predicted weather conditions, planned travel route, or traffic conditions.

The batteries can include a single physical battery or multiple physical batteries that collectively provide power. In the case of multiple physical batteries, the batteries may have the same or different construction or electrochemistry. The process of injecting signals for charging and discharging of the batteries seeks to optimize charging and discharging profiles for a particular battery or a pack of batteries. The pack of batteries can be considered as a single battery where the pack collectively operates together, or the pack of batteries can be considered multiple physical batteries driven one-by-one. Examples of types of batteries include lithium ion, reflow, lead acid, and others.

FIGS. 2-5 are flow charts of methods for active battery management to optimize charging and discharging profiles and parameters. These methods can be implemented in, for example, software modules for execution by processor 10.

Figure 2:
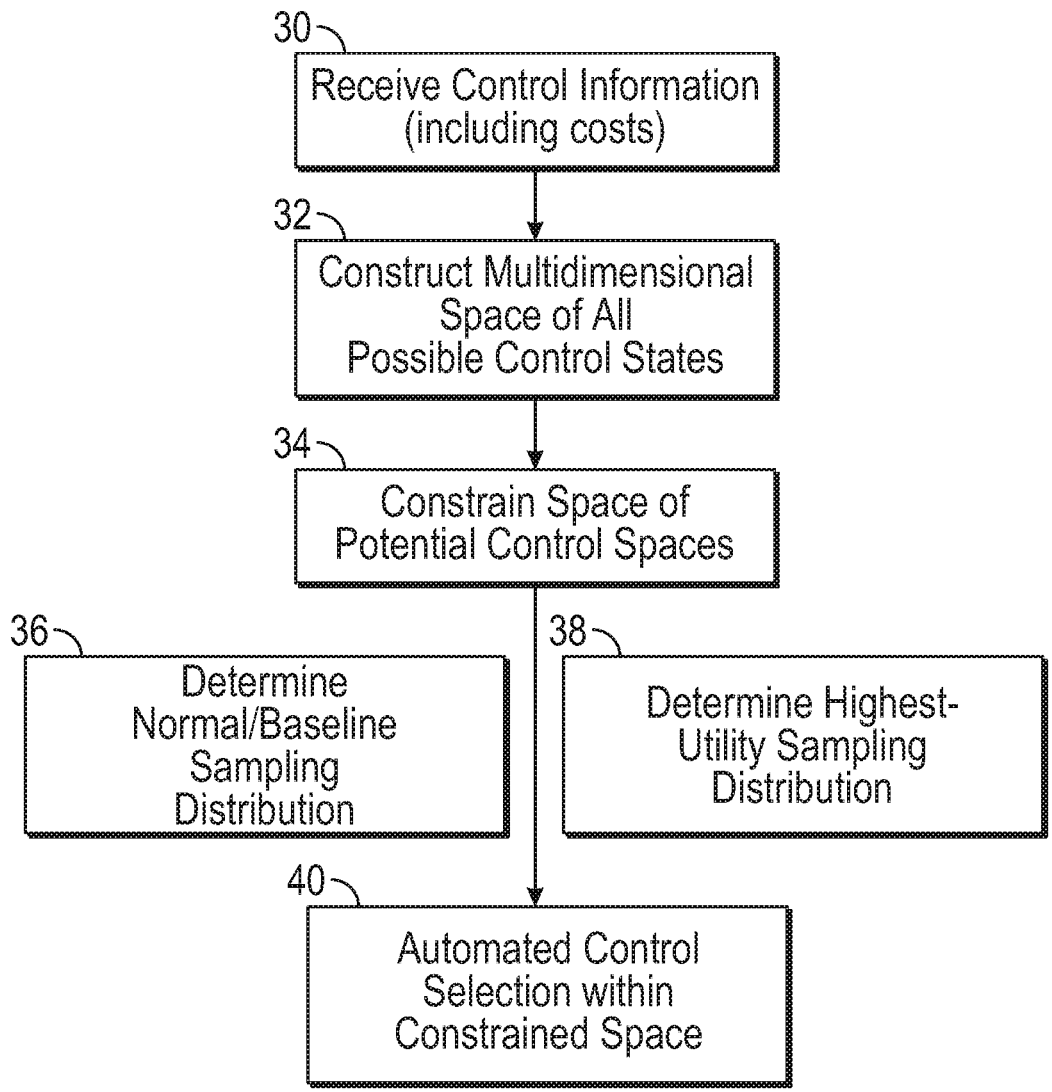
FIG. 2 is a flow chart of a search space method for the system.

FIG. 2 is a flow chart of a search space method. The search space method includes the following steps: receive control information (including costs) 30; construct multidimensional space of all possible control states 32; constrain space of potential control spaces 34; determine normal/baseline sampling distribution 36; determine highest utility sampling distribution 38; and automated control selection within constrained space 40.

Figure 3:
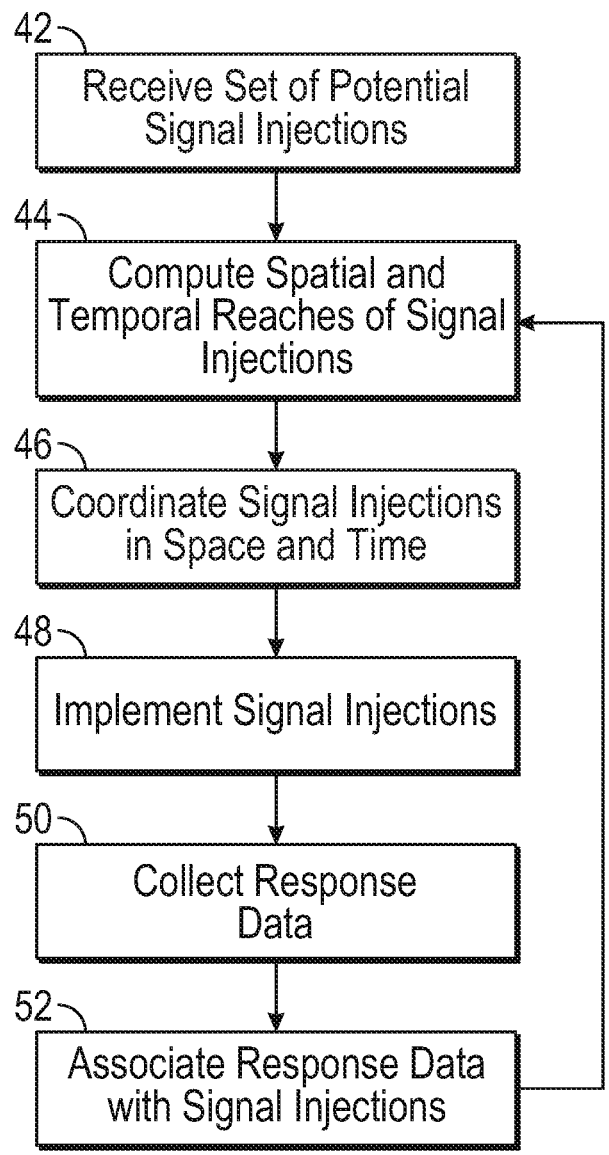
FIG. 3 is a flow chart of a signal injection method for the system.

FIG. 3 is a flow chart of a signal injection method. The signal injection method includes the following steps: receive set of potential signal injections 42; compute spatial and temporal reaches of signal injections 44; coordinate signal injections in space and time 46; implement signal injections 48; collect response data 50; and associate response data with signal injections 52.

The signal injections are changes in charging and discharging profiles and parameters for battery management, including determining when to deliver power back to the power grid. The responses to signal injection are typically battery performance resulting from or related to the changes in profiles and parameters from the signal injections. For example, the algorithm can perturb values in a look-up table representing charging and discharging profiles and parameters, and then monitor and store the corresponding battery performance response. The temporal and spatial reaches of signal injections relate to, respectively, when and where to measure the response signals to those signal injections that are used for computing causal relationships. The cost of signal injection typically relates to how the signal injection affects battery performance, for example signal injection can result in lower battery performance, and is controlled by the specified experimental range. The queue for signal injection involves the order and priority of signal injections and relies on blocking and randomization to guarantee high internal validity at all times, even when optimizing utility. The utility of responses to signal injection involves the effectiveness of the signal injections or other measures of utility.

Figure 4:
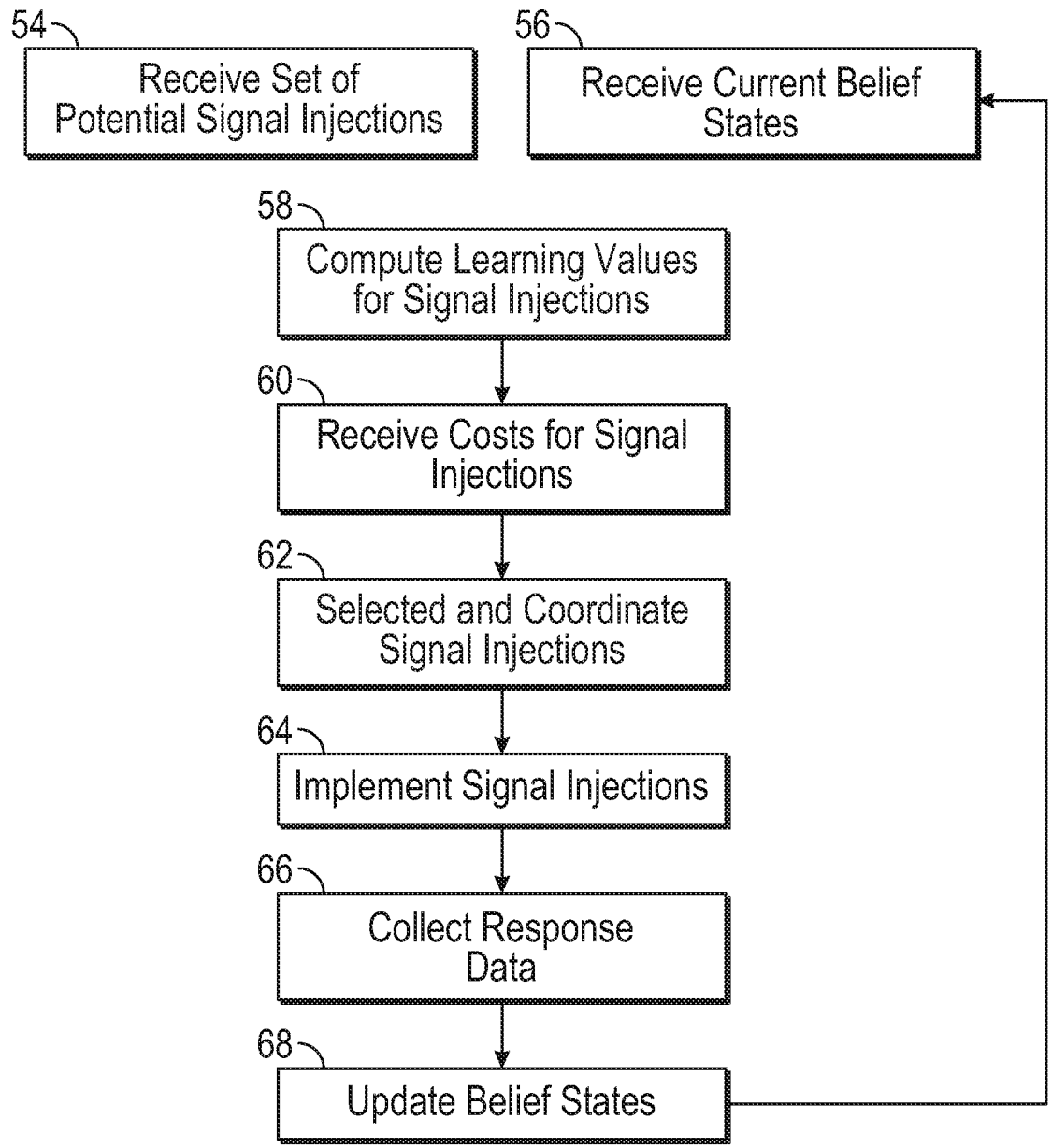
FIG. 4 is a flow chart of a continuous learning method for the system.

FIG. 4 is a flow chart of a continuous learning method. The continuous learning method includes the following steps: receive set of potential signal injections 54; receive current belief states 56; compute learning values for signal injections 58; receive costs for signal injections 60; select and coordinate signal injections 62; implement signal injections 64; collect response data 66; and update belief states 68.

The belief states are a set of different models of battery performance and/or economic benefit models in response to charging and discharging. In the frequency regulation use application, the discharge rate is dictated by the grid load and the charge rate does not significantly impact performance because the SOC is almost always close to 50% (at that SOC level, small charges have little impact on battery life/health). The main drivers of revenue and loss of battery life (the main trade-off) are how much capacity to bid and for what application given the health and state of the battery. These belief states may have attached uncertainty values reflecting the likelihood that they are accurate given the current set of trials and knowledge that may tend to confirm or falsify these different models, and the information that can further confirm or falsify the models may be included in this data or derived from the basic characteristics of the particular model and the physics of the underlying system.

The learning value is a measure of the value that knowledge generated as a result of the signal injection may provide to subsequent decision-making by a system, such as determining that a particular charging or discharging profile is more likely to be optimal. In the sense of a multi-objective optimization, this can include complex trade-offs between operational goals (e.g., performance versus range) and where optimality may vary over time. The learning value may be computed through, for example, predicting the raw number of belief states that may be falsified according to the predictions of a Partially Observable Markov Decision Process (POMDP) or other statistical model, predicted impacts of the signal injection on the uncertainty levels in the belief states in such models, or experimental power analyses computing the reduction in uncertainty and narrowing of confidence intervals based on increasing to the current sample size.

Figure 5:
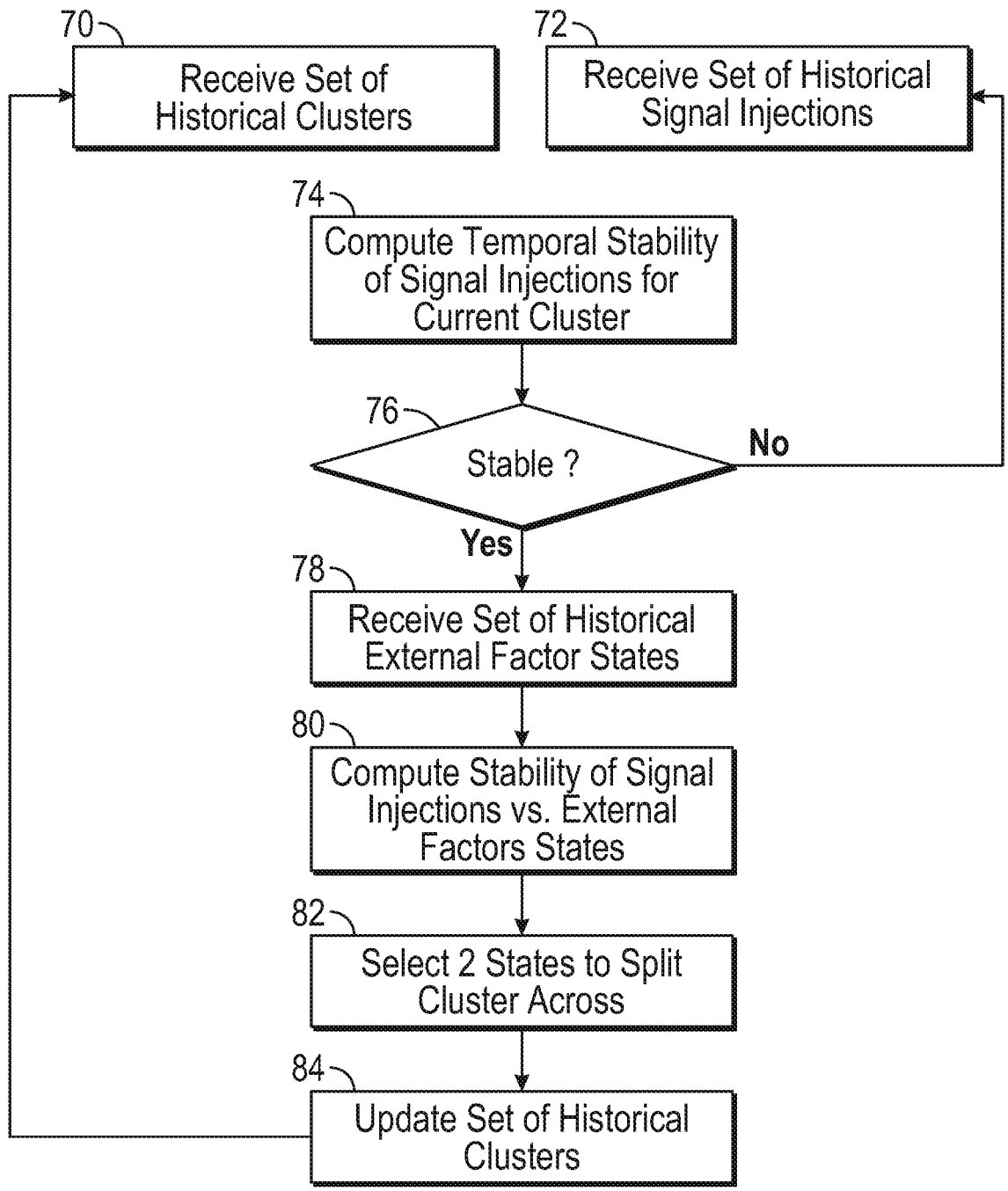
FIG. 5 is a flow chart of a memory management method for the system.

FIG. 5 is a flow chart of a memory management method. The memory management method includes the following steps: receive set of historical clusters 70; receive set of historical signal injections 72; and compute temporal stability of signal injections for current clusters 74. If the signal injections from step 74 are stable 76, then the memory management method executes the following steps: receive set of historical external factor states 78; compute stability of signal injections versus external factors states 80; select two states to split cluster across 82 only if there is enough variance across the two states and enough data within each state (after splitting) to be able to drive decisions in each state (i.e., compute confidence intervals); and update set of historical clusters 84.

A cluster is a group of experimental units that are statistically equivalent with respect to the measure causal effects. Within a cluster, effects are measured free of bias and/or confounding effects from external factors, which guarantees that we are measuring causation and not just correlations/associations. Distribution of measured effects within each cluster are approximately normally distributed.

Table 1 provides an algorithm of an embodiment for automatically generating and applying causal knowledge for active battery management including economic factors. This algorithm can be implemented in software or firmware for execution by processor 10.

TABLE 1

1  inject randomized controlled signals into battery charging and discharging based upon changes in charging and discharging profiles and related parameters, including charging of the battery from a power grid
2  ensure signal injections occur within normal operational ranges and constraints
3  monitor battery performance and/or economic benefit in response to the signal injections
4  compute causal knowledge about the relationship between signal injections and monitored battery performance and/or economic benefit
5  select optimal signals for the battery performance based on current causal knowledge and possibly external data, including discharging the battery into the power grid in exchange for an economic benefit

EXAMPLES

1. Method for Maximizing Delivered Power

Power characterizes the amount of energy per unit time. Maximizing power is a balancing act of minimizing charge time while minimizing the loss in energy capacity with each cycle. In electric vehicle applications, increased power enables faster acceleration and greater performance. In grid applications such as peak shaving where a typical charge/discharge cycle is 24 hours, increased power translates to longer life-time and/or smaller installations.

In this example, we conducted the following experiment: 32 cells were connected to a Maccor cycler (see Reference section for details) with 16 cells partially aged (N cycles/cell on average) and 16 cells brand new (0 cycle/cell). The search space consisted of a family of spline curves defined as cubic Bezier functions (see Reference for definition) that specified the charge profile for each cell. For implementation purposes, these charge curves were discretized into 5 constant-current charge steps. The start point (constant current at 200 mA up to 3.6V) and end point (constant current at 100 mA up to 4.2V) were both fixed; an additional constant voltage step was added at the end of the charge profile (V=4.2V, cutoff current=25 mA) to ensure that each cell reached its full capacity, as commonly done in practice. The 4 independent variables consisted of the two coordinates (cutoff voltage: V, and constant current: I) of the two control points of the cubic Bezier function. Each independent variable was discretized into 8 levels, resulting in a total of 4096 possible combinations. Once fully charged, the cells were discharged under a fixed discharge profile (constant current at 250 mA to 3V).

We focused on the charge profile primarily for the purpose of illustration and simplicity, and the disclosed method can be expanded to the discharge profile as well as any other variable relevant to cell cycling. The Figure Of Merit (FOM) was defined as delivered power calculated as the discharge energy divided by cycle time (i.e., charge time+discharge time). Prior to any significant aging of the cells, both discharge energy and discharge time were nearly constant across cells (or cycles) and the FOM was driven primarily by charge time. Additional dependent variables were recorded with each cycle including charge energy and charge time. External variables were also recorded with each cycle to explore their possible effect of the dependent variables and find clustering opportunities. The external variables included cell identification (ID), old versus new cell, discharge energy and discharge time.

Data was recorded over weeks. During the initial explore phase, the algorithm assigned charge profiles randomly across the search space and built confidence intervals (CIs) around the expected causal effect of each IV level on the FOM. Once some of the CIs were significantly distinct and non-overlapping, which occurred after exploring ~30% of the total search space, the algorithm started exploiting that knowledge by assigning more frequently levels with the highest utility, resulting in a gradual increase in the FOM. The algorithm also started identifying clusters across which causal effects where statistically different. While the optimum levels may not change across clusters, their relative effects did change due to differential ageing and differential initial state of health.

Figure 6A:
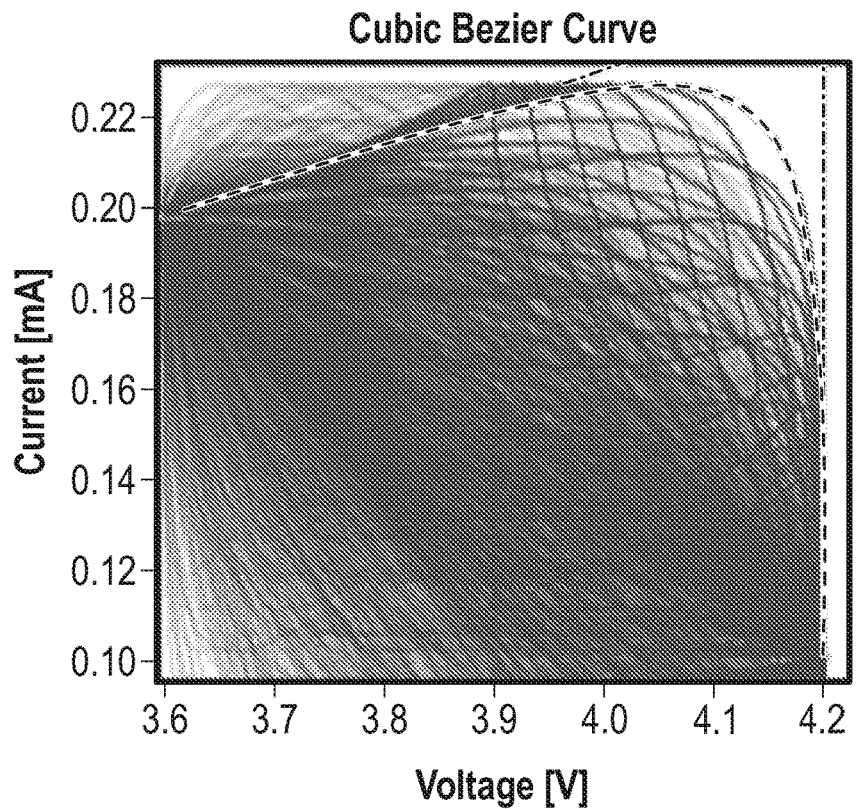
FIGS. 6A-6D illustrate the search space of all possible charge profiles for the Examples.
Figure 6B:
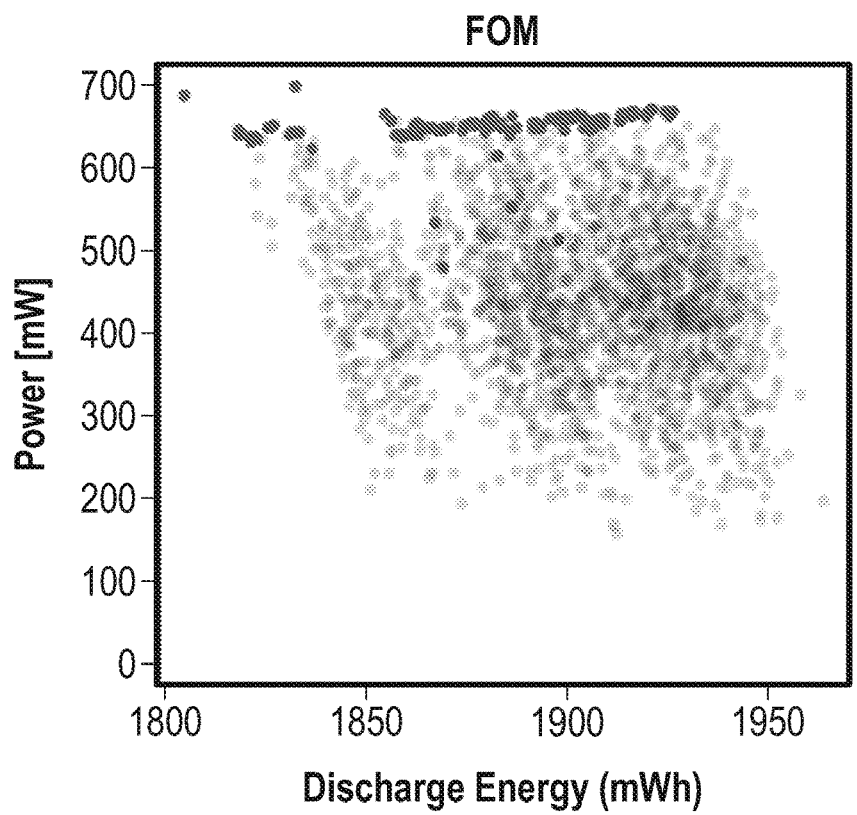
Figure 6C:
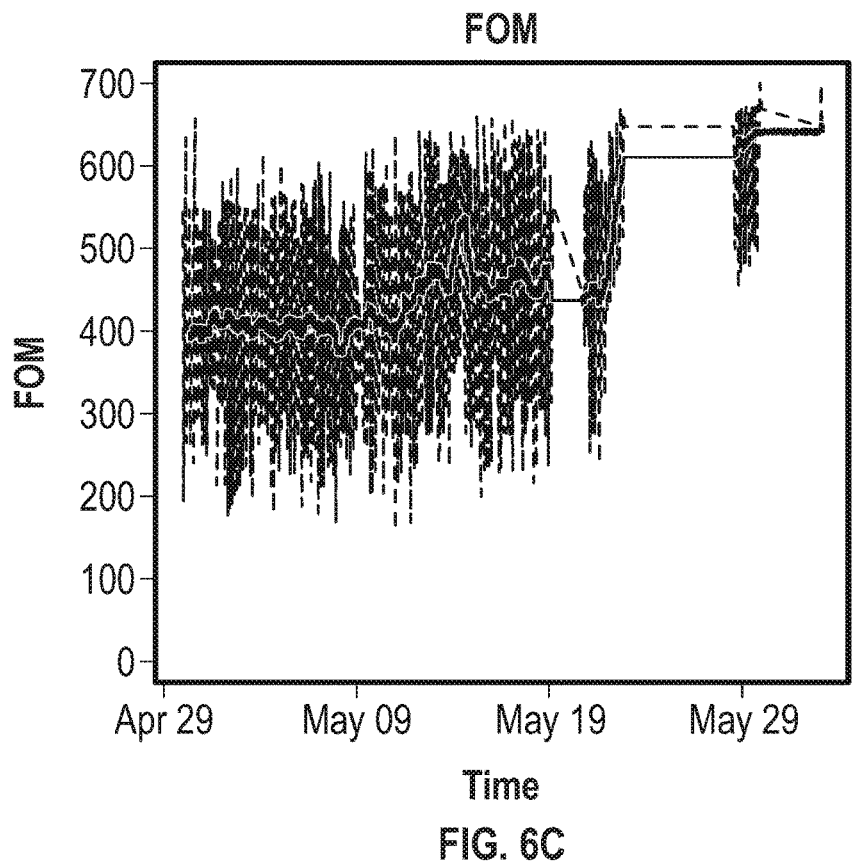
Figure 6D:
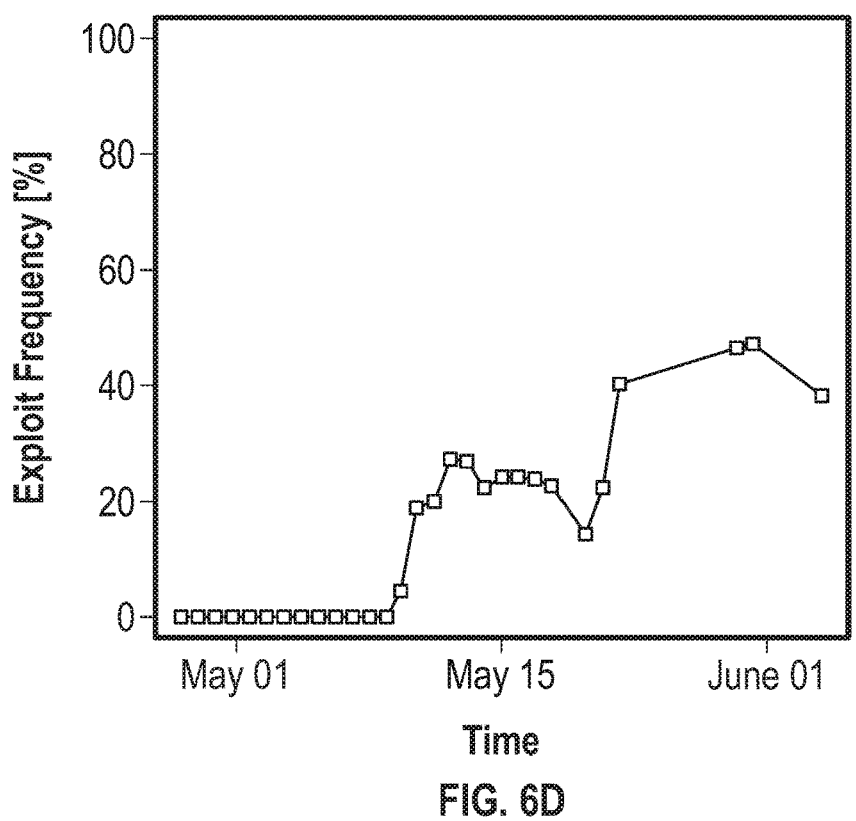

FIGS. 6A-6D show the search space of all possible charge profiles for the described experiment. In FIG. 6A, the optimum charge profile is shown as the dashed line with its end points and control handle points shown as the dot-dashed line. The chosen FOM (total delivered power) is plotted versus discharge energy. The power values associated with the optimum charge profile are shown as the dark gray circles. The FOM and the exploit frequency are also plotted as a function of time. FIG. 6A shows the search space of all possible charge profiles. FIG. 6B shows the FOM versus discharge energy. FIG. 6C shows the FOM versus time. FIG. 6D shows the exploit frequency.

Figure 7A:
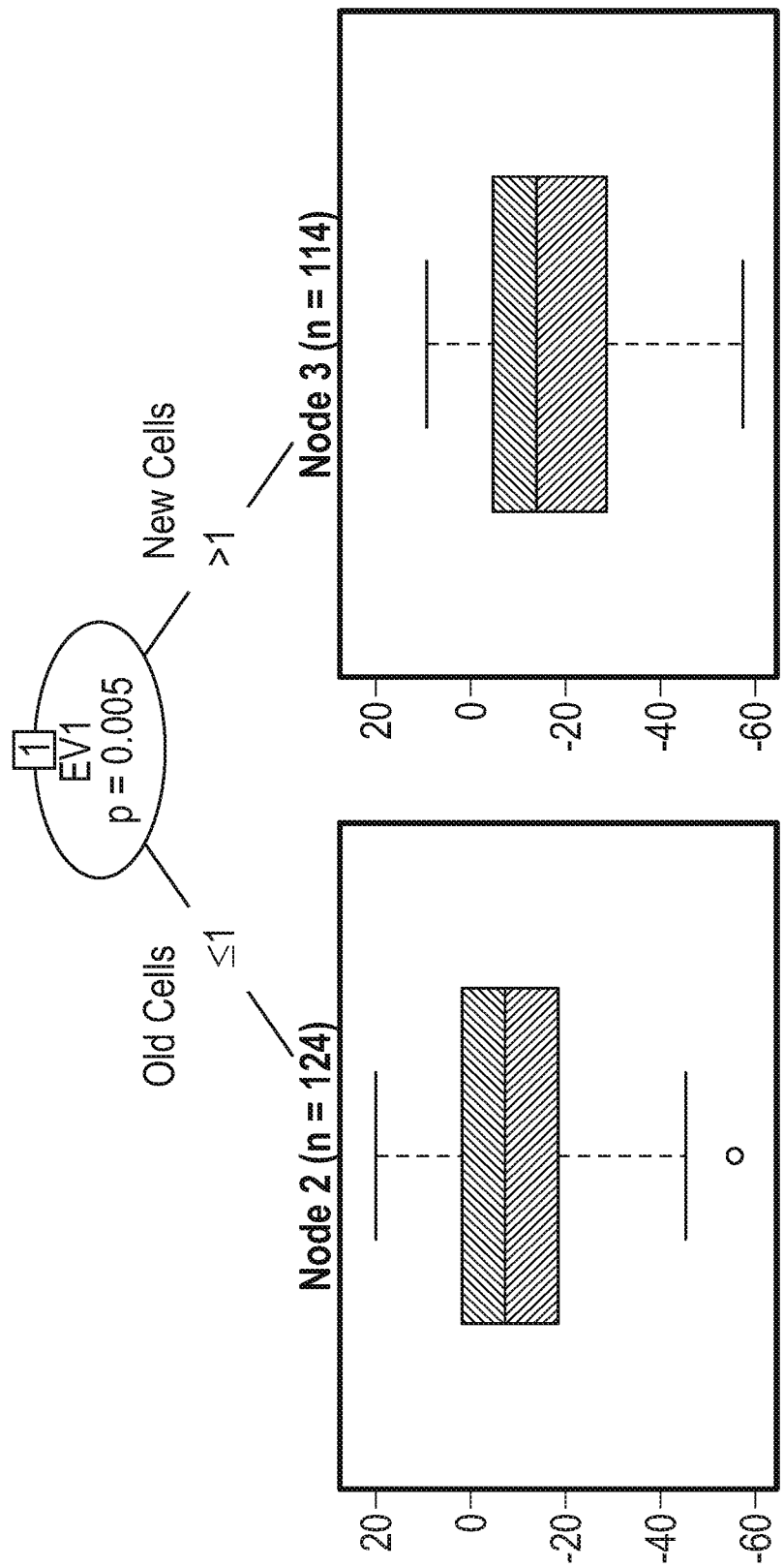
FIGS. 7A-7C illustrate that the algorithm in the Examples identified distinct effect sizes for old cells versus new cells.
Figure 7B:
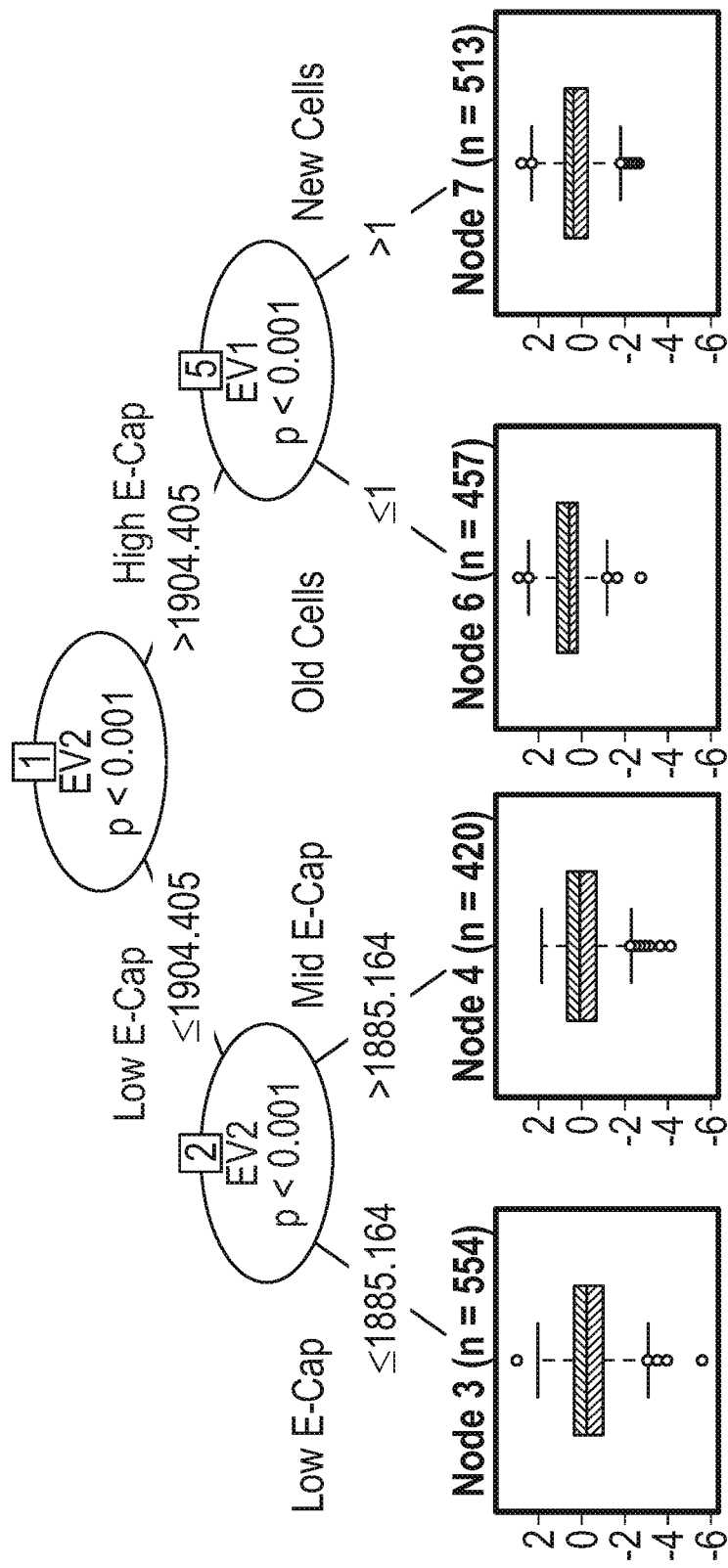
Figure 7C:
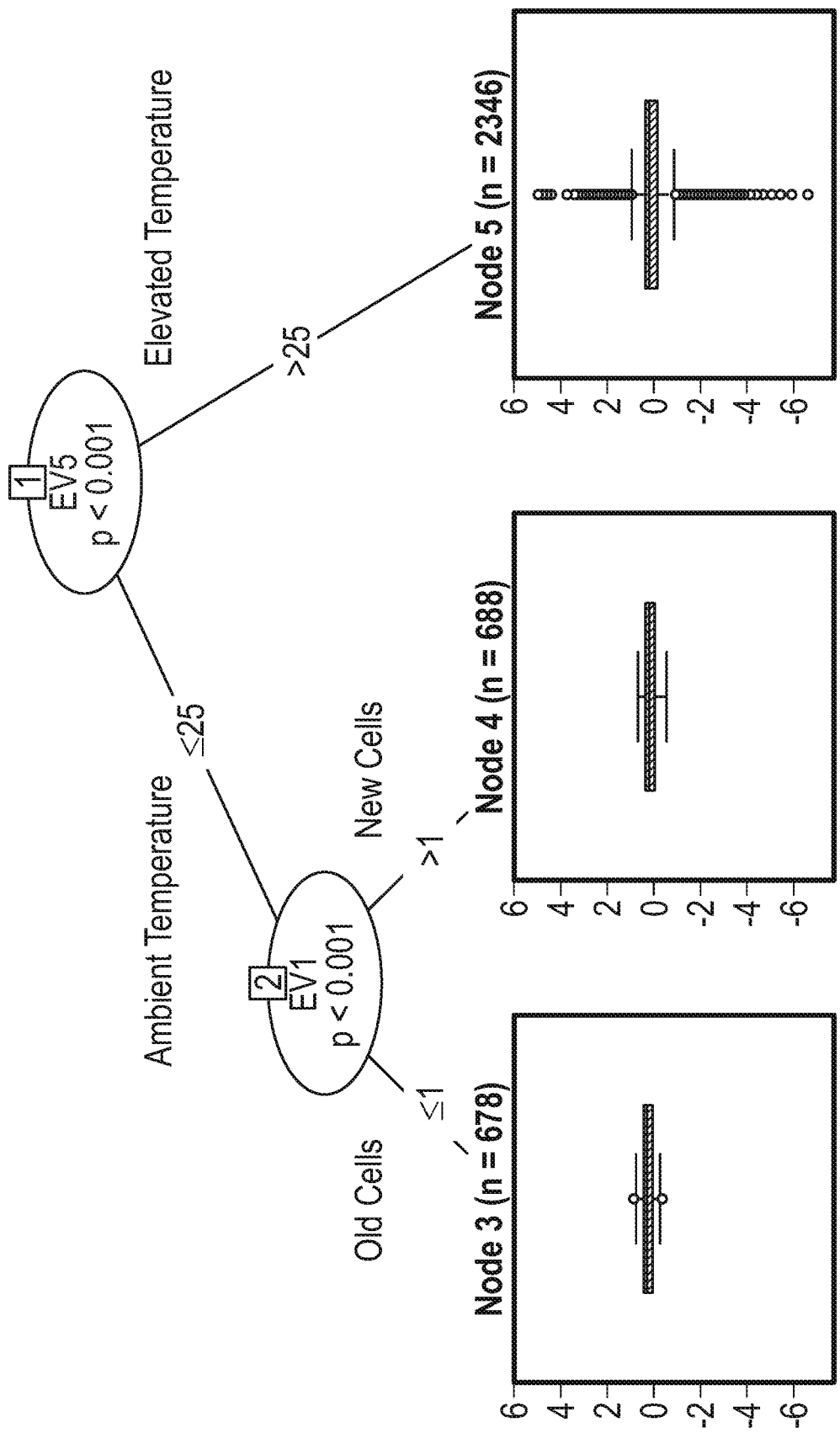

FIGS. 7A-7C show that, over time, the algorithm identified distinct effect sizes for old cells versus new cells. Once clustering is initiated, the algorithm exploits charge profiles that are optimum for each distinct cluster, which may or may not be the same across clusters. FIGS. 7A and 7B illustrate the Example of method for maximizing delivered power, where E-Cap refers to energy capacity. FIG. 7C illustrates the Example of method for maximizing delivered power under environmental conditions.

2. Method for Measuring Cell Internal Resistance

Data from the previous experiment was also analyzed to characterize the internal resistance of the cells during each cycle and over time. Mapping the internal resistance as a function of current and state of charge (SOC) can typically be accomplished by performing complete cycles at various rates. This analysis is time consuming and, furthermore, only represents the internal resistance at the beginning of the life of the cell. This analysis can also be inaccurate because the results of once cycle are not independent of the previous cycle. By randomizing with the algorithm disclosed herein, this effect is mitigated.

Here, data from each actual cycle was used to estimate internal resistance in the following way: for each constant-current step, the internal resistance value was approximated by R=ΔV/ΔI, where ΔV was the change in average potential compared to a reference cell cycled at 25 mA and ΔI was the current difference compared to the reference cell. R was estimated for each cell, each cycle and each of the 5 constant-current steps. A nearly continuous curve of internal resistance versus state of charge was obtained, illustrating the expected behavior of Li-ion batteries. These results are shown in FIGS. 8A-8C.

Figure 8A:
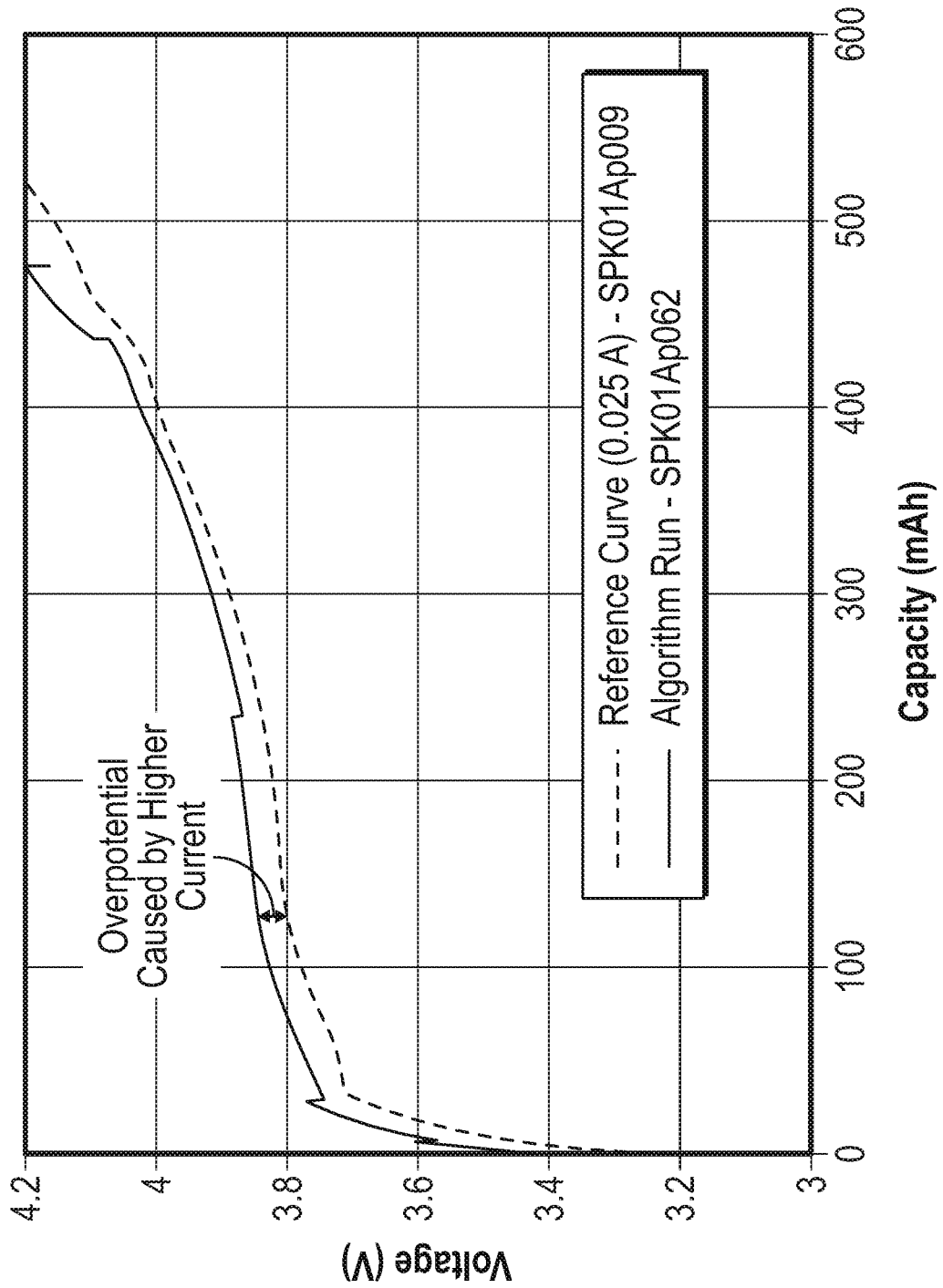
FIGS. 8A-8C illustrate voltage versus capacity for a charge profile assigned by the algorithm in the Examples.
Figure 8B:
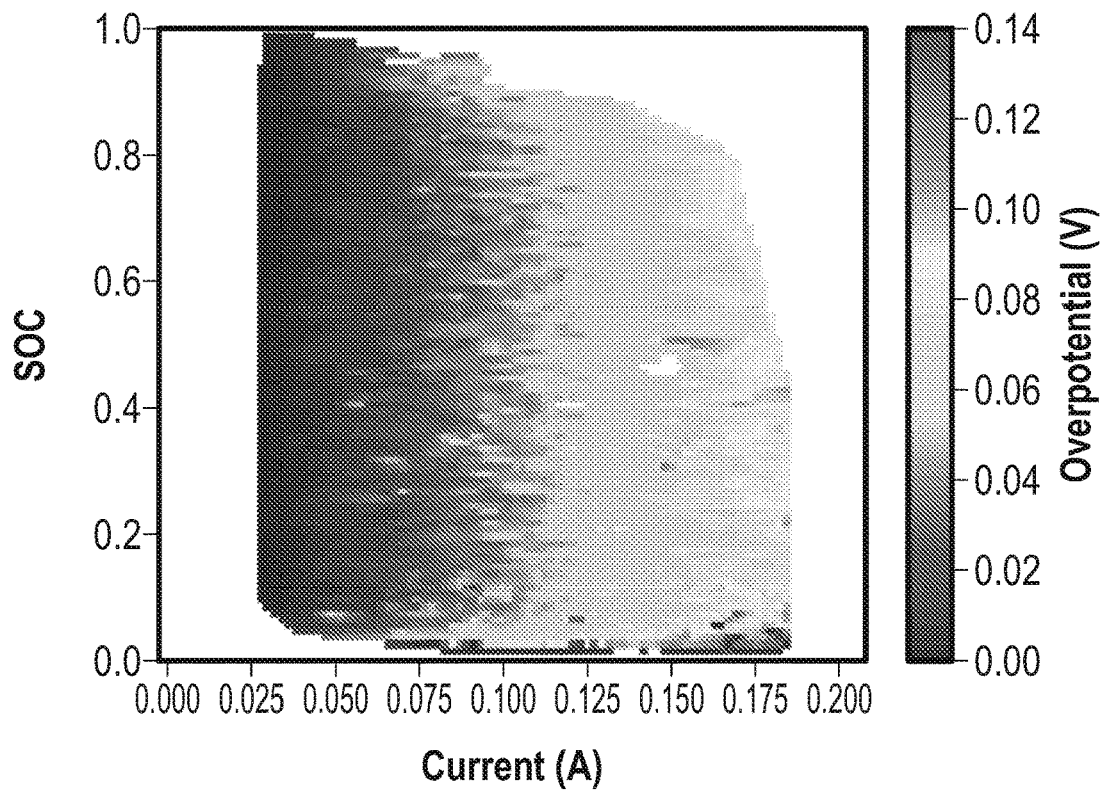
Figure 8C:
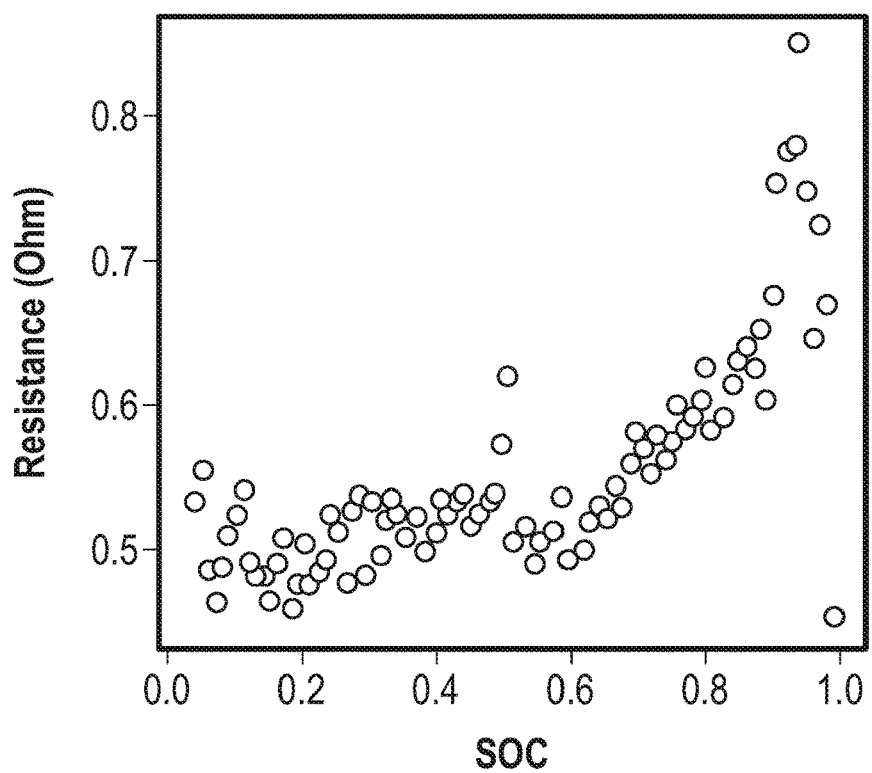

FIG. 8A shows voltage versus capacity for a charge profile assigned by the algorithm (solid line) versus reference C/20 charge profile (dashed line) illustrating the overpotential ΔV. FIG. 8B shows SOC and overpotential versus current. FIG. 8C shows internal resistance versus SOC.

Knowledge of in situ internal resistance over time can be used to improve the performance and safety of the battery management system by eliminating charge profiles in the search space that could lead to significant over- and under-voltage, heating and degradation of the cells. Internal resistance maps can be built from subgroups within the data, and examples of possible subgroups include but are not limited to: cell age, number of cycles, temperature exposure, cumulative discharged energy, average discharge current, average charge current, maximum charge current, average voltage, manufacturing batch. Changes in internal resistance can also be used to detect anomalous conditions such as onset of a short circuit in a battery pack.

3. Method for Balancing Cells in a Pack

Beyond maximizing power, causal knowledge of the effects of charge profile variables on cell power can also be used to optimize other utility metrics, such as balancing state of health (SOH) or internal resistance across cells. While cell aging tends to be fairly uniform at the beginning of battery life (within manufacturing tolerances), it becomes increasingly more heterogeneous and unpredictable with each additional charge/discharge cycle. This is an important consideration when repackaging used cells into packs for new applications as a way to extent their life time in less demanding applications. One example is reusing EV batteries for grid-level energy storage. The development of smart battery management systems that are capable of balancing cell ageing is critical to ensure safe, reliable and durable operations and make the application economically viable. Accurate determination of the internal resistance of each cell as well as clustering across homogeneous cell groups is an effective mechanism to quantitatively implement cell balancing in practice.

Similarly, hybrid vehicles can use systems that combine different types of cells with different performance and ageing characteristics. The power grid can use systems that combine high power and high energy storage. This translates to greater variance in the data, resulting in greater difficulty to apply standard data analytics techniques for battery management. The algorithm disclosed herein can address this type of problem by automatically identifying the minimum set of homogeneous clusters that can be used for reliable causal inference over time. The algorithm disclosed herein can also be used to implement experiments on batteries across different vehicles.

4. Method for Maximizing Delivered Power Under Different Environmental Conditions In many applications, batteries are exposed to different environmental conditions due to weather, infrequent operations, and more. For the purpose of illustration, we focused on ambient temperature as an external factor, which is common to many applications and has a large known effect of cell performance. We conducted a second set of experiments with 8 cells placed in an oven under elevated ambient temperature of 45° C. The results showed how the optimum charge profile varies with environmental conditions.

5. Vehicle-to-Grid

Vehicle-to-grid (V2G) refers to a system in which plug-in electric vehicles, such as battery powered electric vehicles, electric hybrid vehicles, or hydrogen fuel cell electric vehicles, communicate with the power grid to sell demand response services by either returning electricity to the grid or by throttling their charging rates. V2G can thus be used with plug-in electric vehicles with grid capacity. Since at any given time most vehicles are parked, the batteries in electric vehicles could be used to allow electricity flow from the vehicle to the electric distribution network and back. V2G storage capabilities can also enable electric vehicles to store and discharge electricity generated from renewable energy sources, such as solar and wind, with output that fluctuates depending on weather and time of day.

Batteries have a finite number of charging cycles as well as a shelf-life. Therefore, using vehicles as grid storage can impact battery longevity. For example, cycling batteries two or more times per day have shown large decreases in capacity and greatly shortened life. However, battery capacity is a complex function of factors such as battery chemistry, charging and discharging rate, temperature, state of charge and age.

Considering the uncertainty around whether or not it is economically profitable or beneficial to sell a portion of the available capacity in the electric vehicle battery pack (energy arbitrage) at any given time given a particular cell history, deep causal learning can be used to optimize profit and/or total cost of ownership of an electric vehicle. For example, the vehicle or fleet owner could set the maximum allowed depth of discharge (or equivalently estimated minimum range for the vehicle(s) if it was needed before full recharge) as well as the daily schedule when the vehicle will next be required to be available for driving (presumably at full charge). Within the battery management systems, parameters controlling the charging profile from a given depth of discharge, status of external heaters for the battery pack, and discharge rate (up to the maximum allowed by the circuit the vehicle is plugged into) are also independent variables.

Neglecting the electricity cost associated with external heaters for the battery pack, the potential profit (dependent variable) from selling some of the available energy stored in the battery pack for the next available hour can be calculated as described by in the following equation (1) in the publication by S. B. Peterson, J. F. Whitacre and J. Apt, *J. Power Sources* 195, (2010) 2377-2384):

$$\text{profit}(\$) = \{LMP_{Sell} + T\&D) \times DCH_{\mathit{eff}} - \frac{LMP_{buy} + T\&D}{CH_{\mathit{eff}}}\} \times$$

-continued $$kWh_{transacted} - \text{degradation cost}$$

where
LMP$_{sell}$ is the selling price of electricity at current time ($/kWh);
LMP$_{sell}$ is the buying price of electricity at scheduled recharge time ($/kWh);
DCH$_{eff}$ is the discharge efficiency;
CH$_{eff}$ is charge efficiency; and
T&D is transmission and distribution cost ($/kWh).

The degradation cost associated with energy arbitrage discharge depends on the battery replacement cost, the current estimated state of health (SOH) of the battery, the state of health at which the battery is no longer considered useful for its primary application (SOH$_{min}$, typically set at 80% for vehicles or other stationary battery backup systems), and the V2G Deg coefficient which is the marginal effect of the next discharge/charge cycle on the state of health of the battery.

$$\text{degradation cost} = \frac{\text{replacement cost} \times V2G\,\text{Deg}}{SOH_{min} - 1}(1 - SOH)$$

The kWh$_{transacted}$ (or available to transact) is the state of charge of the battery (SOC) minus the maximum depth of discharge allowed.

In the absence of uncertainty about the SOH or SOC of the battery, the problem reduces to a scheduling problem with uncertainty in the hourly electricity pricing which can be handled using conventional Monte Carlo techniques. However, both SOC and SOH (which includes the effect of internal resistance) are complicated functions of the cell history. Thus, by continually experimenting on the independent variables provided below, deep causal learning can optimize the policy as to when and how to discharge/recharge the battery pack as to maximize profit or total cost of ownership (initial cost−total profit over the life of the battery) while still leaving sufficient charge available for primary vehicle use when needed.

Independent variables include:
C$_{dis}$=discharge rate (kW/h);
DoD=Maximum depth of discharge (with respect to initial capacity);
Scheduled time charge must be complete;
Charge profile (current, voltage, and temperature profile through each segment); and
ΔN=num cycles between a full discharge to assess state of charge.

A similar analysis applies to the case of using the energy capacity of any other stationary storage or battery backup system, such as an un-interruptible power system, although without the constraints of having to use the system for vehicle power. In the frequency regulation market the battery pack owner or provider offers a certain amount of power to the grid at a price where they believe net profit from equation (1) will be greater than zero. If the provider wins the bid for that time period, the provider must follow through or be penalized in future bidding rounds. The penalty factor becomes an external variable in the economic analysis for this type of system.

References for Examples 1-4
Cells: Rechargeable Li-ion polymer battery wound pouch cells, 5.0×30×35 mm, nominal capacity 500 mAh; graphite anode and LiCoO$_2$ cathode (E-Group, Mt. Laurel, New Jersey).
Maccor: 96 channel, Series 4000 Maccor (Tulsa, Oklahoma).

Cubic Bezier Function:
Four points P$_0$, P$_1$, P$_2$ and P$_3$ in the plane or in higher-dimensional space define a cubic Bezier curve. The curve starts at P$_0$ going toward P$_1$ and arrives at P$_3$ coming from the direction of P$_2$. Usually, the curve will not pass through P$_1$ or P$_2$; these points are only there to provide directional information. The distance between P$_1$ and P$_2$ determines "how far" and "how fast" the curve moves toward P$_1$ before turning toward P$_2$.

Writing B$_{Pi,Pj,Pk}$(t) for the quadratic Bezier curve defined by P$_i$, P$_j$, and P$_k$, the cubic Bezier curve can be defined as an affine combination of two quadratic Bezier curves:

$$B(t) = (1-t)B_{P0,P1,P2}(t) + tB_{P1,P2,P3}(t),\ 0 \le t \le 1$$

The explicit form of the curve is:

$$B(t) = (1-t)^3 P_0 + 3(1-t)^2 t P_1 + 3(1-t)t^2 P_2 + t^3 P_3,\ 0 \le t \le 1$$

For some choices of P$_1$ and P$_2$ the curve may intersect itself or contain a cusp.

The invention claimed is:

1. A method for active battery management, comprising steps of:
providing signal injections for charging or discharging of a battery, including charging of the battery from a power grid;
receiving response signals corresponding with the signal injections;
measuring a utility of the response signals;
accessing data relating to charging or discharging of the battery, including discharging the battery into the power grid in exchange for an economic benefit; and
modifying the data based upon the utility of the response signals.

2. The method of claim 1, wherein the signal injections comprise a charging profile or a discharging profile.

3. The method of claim 1, wherein the signal injections comprise a charging rate or a discharging rate.

4. The method of claim 1, wherein the signal injections comprise charging profile endpoints or discharging profile endpoints.

5. The method of claim 1, wherein the accessing step comprises accessing a look-up table.

6. The method of claim 1, wherein the signal injections have a spatial reach.

7. The method of claim 1, wherein the signal injections have a temporal reach.

8. The method of claim 1, wherein the modifying step further comprises modifying the data based upon external data comprising environmental conditions.

9. The method of claim 8, wherein the environmental conditions comprise at least one of a temperature, a humidity, or an airflow around the battery.

10. The method of claim 1, wherein the providing step further comprises selecting a depth of discharge back into the power grid.

11. The method of claim 1, wherein the economic benefit is one of a net profit or a total cost of ownership.

12. A device comprising:
   memory comprising instructions;
   a processor coupled to the memory, wherein the processor is configured by the instructions to:
   provide signal injections for charging or discharging of a battery, including charging of the battery from a power grid;
   receive response signals corresponding with the signal injections;
   measure a utility of the response signals;
   access data relating to charging or discharging of the battery, including discharging the battery into the power grid in exchange for an economic benefit; and
   modify the data based upon the utility of the response signals.

13. The device of claim 12, wherein the signal injections comprise a charging profile or a discharging profile.

14. The device of claim 12, wherein the signal injections comprise a charging rate or a discharging rate.

15. The device of claim 12, wherein the signal injections comprise charging profile endpoints or discharging profile endpoints.

16. The device of claim 12, wherein accessing comprises accessing a look-up table.

17. The device of claim 12, wherein the signal injections have a spatial reach.

18. The device of claim 12, wherein the signal injections have a temporal reach.

19. The device of claim 12, wherein modifying further comprises modifying the data based upon external data comprising environmental conditions.

20. The device of claim 19, wherein the environmental conditions comprise at least one of a temperature, a humidity, or an airflow around the battery.

* * * * *